(12) United States Patent
Seo et al.

(10) Patent No.: US 9,153,745 B2
(45) Date of Patent: Oct. 6, 2015

(54) LIGHT-EMITTING DIODE PACKAGE AND METHOD OF FABRICATING THE SAME

(75) Inventors: Won Cheol Seo, Ansan-si (KR); Yeo Jin Yoon, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 326 days.

(21) Appl. No.: 13/825,937

(22) PCT Filed: Dec. 3, 2010

(86) PCT No.: PCT/KR2010/008627
§ 371 (c)(1),
(2), (4) Date: Jun. 7, 2013

(87) PCT Pub. No.: WO2012/039528
PCT Pub. Date: Mar. 29, 2012

(65) Prior Publication Data
US 2014/0145633 A1    May 29, 2014

(30) Foreign Application Priority Data

Sep. 24, 2010   (KR) .................. 10-2010-0092849

(51) Int. Cl.
*H01L 33/38* (2010.01)
*H01L 33/48* (2010.01)
*H01L 33/08* (2010.01)
(Continued)

(52) U.S. Cl.
CPC .............. *H01L 33/385* (2013.01); *H01L 33/08* (2013.01); *H01L 33/486* (2013.01);
(Continued)

(58) Field of Classification Search
CPC ..... H01L 25/167; H01L 33/385; H01L 33/08; H01L 33/486; H01L 33/641; H01L 33/62; H01L 33/60; H01L 33/48; H01L 33/38; H01L 33/36; H01L 33/483; H01L 33/502; H01L 33/504; H01L 33/00; H01L 33/64; H01L 33/642; H01L 33/58; H01L 33/52; H01L 33/56; H01L 33/50; H01L 33/501; H01L 33/40; H01L 33/405; H01L 29/66106; H01L 29/866

See application file for complete search history.

(56) References Cited

U.S. PATENT DOCUMENTS

2007/0018191 A1 *   1/2007   Roh et al. ................. 257/99
2007/0252523 A1    11/2007   Maeda et al.
(Continued)

FOREIGN PATENT DOCUMENTS

JP   2007-150229   6/2007
KR   10-2008-0051877   6/2008
(Continued)

OTHER PUBLICATIONS

International Search Report dated Oct. 31, 2011 issued to related International Application No. PCT/KR2010/008627.

*Primary Examiner* — Anthony Ho
*Assistant Examiner* — Samuel Lair
(74) *Attorney, Agent, or Firm* — H.C. Park & Associates, PLC (57) ABSTRACT

A Light Emitting Diode (LED) package and a method of manufacturing the same. The LED package includes a substrate. The substrate defines therein a cavity having a tapered shape, a stepped portion formed on the upper end of the cavity, and a through hole formed in the bottom of the cavity. A conductive film fills the through-hole and is formed on the bottom and the side surfaces of the cavity. An LED has a fluorescent layer thereon, and is flip-chip bonded onto the conductive film. An encapsulant encapsulates the cavity. A Zener diode or a rectifier is provided on the silicon substrate.

16 Claims, 6 Drawing Sheets

(51) Int. Cl.
  *H01L 25/16* (2006.01)
  *H01L 33/60* (2010.01)
  *H01L 33/62* (2010.01)
  *H01L 33/64* (2010.01)

(52) U.S. Cl.
  CPC .............. *H01L 25/167* (2013.01); *H01L 33/60* (2013.01); *H01L 33/62* (2013.01); *H01L 33/641* (2013.01); *H01L 2224/16225* (2013.01); *H01L 2933/0033* (2013.01)

(56) References Cited

U.S. PATENT DOCUMENTS

| | | | |
|---|---|---|---|
| 2008/0006837 A1* | 1/2008 | Park et al. | 257/98 |
| 2009/0045417 A1* | 2/2009 | Chao et al. | 257/89 |
| 2010/0006873 A1* | 1/2010 | Raring et al. | 257/90 |
| 2010/0133568 A1* | 6/2010 | Komatsu et al. | 257/98 |
| 2010/0207152 A1* | 8/2010 | Won | 257/98 |
| 2010/0213498 A1* | 8/2010 | Kim | 257/99 |
| 2010/0230712 A1* | 9/2010 | Han | 257/99 |
| 2010/0248400 A1* | 9/2010 | Kim | 438/15 |
| 2010/0295089 A1 | 11/2010 | Kim et al. | |
| 2011/0012153 A1* | 1/2011 | Kim | 257/98 |
| 2011/0057209 A1* | 3/2011 | Kim | 257/88 |

FOREIGN PATENT DOCUMENTS

| | | |
|---|---|---|
| KR | 10-2009-0010445 | 1/2009 |
| KR | 10-2009-0044667 | 5/2009 |

* cited by examiner

LIGHT-EMITTING DIODE PACKAGE AND METHOD OF FABRICATING THE SAME

CROSS-REFERENCE TO RELATED APPLICATIONS

This Application is the National Stage entry of International Application No. PCT/KR2010/008627, filed on Dec. 3, 2010, and claims priority from and the benefit of Korean Patent Application No. 10-2010-0092849, filed on Sep. 24, 2010, which are incorporated by reference as if fully set forth herein.

BACKGROUND

1. Field

The present invention relates to a light-emitting diode package and a method of fabricating the same, and more particularly, to a light-emitting diode package and a method of fabricating the same, in which a Zener diode or a rectifier is provided on a silicon substrate so that heat can be easily dissipated without an additional device, thereby reducing manufacturing cost and making miniaturization possible.

2. Discussion of the Background

A Light Emitting Diode (LED) is a light-emitting semiconductor device that converts electricity into light. Red LEDs, which use a GaAsP compound semiconductor, and green LEDs, which use a GaP:N semiconductor, have been used as light sources for the display of electronic devices, such as information communication devices.

The wavelengths of light emitted from the LED vary depending on the band gaps of semiconductor materials, which indicate the energy difference between valance band electrons and conduction band electrons. Gallium nitride (GaN) semiconductor can be combined with other elements, such as indium (In) and aluminum (Al), to produce semiconductor layers that emit green, blue, and white light. Thanks to its high thermal stability and wide band gap (0.8 to 6.2 eV), the GaN semiconductor is being utilized for the development of high power electronic devices.

The LED is a device having weak voltage resistance characteristics, meaning that its lifetime is disadvantageously reduced by static electricity or voltage surges, which occurs when measurement or packaging is performed. In order to improve the voltage resistance characteristics, a Zener diode is used.

In addition, in the case in which a high-voltage Alternating Current (AC) power source is used, the LED is required to be provided with a rectifier circuit such as a bridge. For this, the LED of the related art is provided with a separate rectifier circuit, and both the LED and the rectifier circuit are provided as a single package.

In addition, thanks to the characteristics of a semiconductor layer, which forms a light-emitting layer, the LED dissipates energy that is not converted into light in the form of heat. In order to minimize the heat, methods of providing a heat sink or using a material that can easily dissipate heat have been proposed.

The LED package of the related art employs a structure in which lead frames are covered with Poly Phthal Amide (PPA) resin, a structure in which lead frames are provided with a metal heat sink, a structure in which a ceramic material is used, or the like.

In particular, in fields in which a high input voltage is used and good heat-dissipation characteristics are required, an LED package made of a ceramic material, in which a metal heat sink is mounted, is widely used.

The LED package of the related art exhibits excellent heat dissipation, since a package body is provided in such a manner that it surrounds a heat sink. However, the addition of the heat sink makes it difficult to manufacture a small product. In addition, moisture may penetrate through the interface between the heat sink and the package body, thereby disadvantageously lowering reliability.

In addition, the ceramic package exhibits excellent heat dissipation and product reliability. However, in the case in which an additional device is separately provided or integrally formed in order to satisfy the object of the LED package, there are problems in that processing is complicated and it is difficult to manufacture a product at low cost.

SUMMARY

Various aspects of the present invention provide a Light Emitting Diode (LED) package and a method of manufacturing the same, in which a Zener diode or a rectifier is provided on a silicon substrate so that heat can be easily dissipated without an additional device, thereby reducing manufacturing cost and making miniaturization possible.

In an aspect of the present invention, the LED package includes a substrate, wherein the substrate defines therein a cavity having a tapered shape, a stepped portion formed on the upper end of the cavity, and a through hole formed in the bottom of the cavity; a conductive film, wherein the conductive film fills the through-hole and is formed on the bottom and the side surfaces of the cavity; an LED having a fluorescent layer thereon, wherein LED is flip-chip bonded onto the conductive film; and an encapsulant encapsulating the cavity.

It is preferable that the conductive film be an Al film or an Ag film.

It is preferable that the conductive film be formed under the stepped portion.

It is preferable that the substrate be a silicon substrate.

It is preferable that the LED package further include a Zener diode formed in the area of the substrate under the cavity.

It is preferable that the LED include a plurality of light-emitting cells.

It is preferable that the LED package further include a rectifier formed on the upper portion of the substrate.

It is preferable that the rectifier be a diode bridge.

In an aspect of the present invention, the method of fabricating a LED package includes the following steps of: preparing an insulating silicon substrate; forming a cavity in the silicon substrate and a stepped portion formed in the upper end of the cavity, wherein an LED is intended to be mounted in the cavity; forming a through-hole in the bottom of the cavity; forming a conductive film on the through-hole, the bottom, and the side surfaces of the cavity; flip-chip bonding the LED on the conductive film on the bottom of the cavity, wherein the LED has a fluorescent layer formed thereon; and encapsulating the cavity.

It is preferable that the step of forming a conductive film includes the step of depositing Al or Ag on the bottom and the side surfaces of the cavity.

It is preferable that, in the step of forming a conductive film, the conductive film be formed under the stepped portion.

It is preferable that the method further include, after the step of forming a through-hole, the step of forming a Zener diode on the silicon substrate in the area under the cavity.

It is preferable that, in the step of forming a Zener diode, the Zener diode be formed by ion implantation It is preferable that the LED include a plurality of light-emitting cells.

It is preferable that method further include, after the step of forming a cavity, the step of forming a rectifier on the upper portion of the silicon substrate.

It is preferable that, in the step of forming a rectifier, the rectifier be formed by bridging diodes on the substrate.

According to exemplary embodiments of the invention, the LED package using the silicon substrate can exhibit excellent heat dissipation without an additional heat sink and make it possible to form the Zener diode and/or the rectifier on the silicon substrate by obviating an additional device. Thereby, the package can be fabricated at low cost and be miniaturized.

DETAILED DESCRIPTION OF THE ILLUSTRATED EMBODIMENTS

The present invention will now be described more fully hereinafter with reference to the accompanying drawings, in which exemplary embodiments thereof are shown, so that this disclosure will fully convey the scope of the present invention to those skilled in the art. This invention can, however, be embodied in many different forms and should not be construed to be limited to the embodiments set forth herein.

Figure 1:
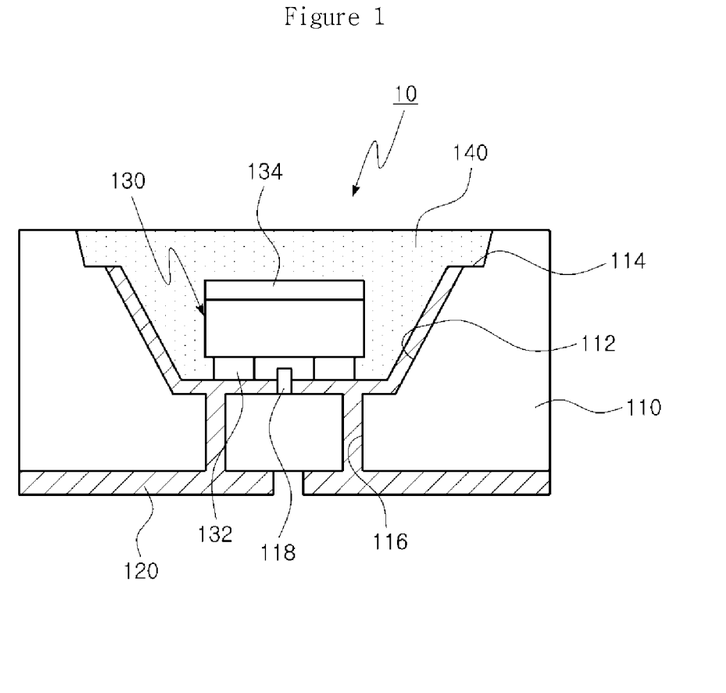
FIG. 1 is a cross-sectional view showing an LED package according to a first exemplary embodiment of the invention.

First, with reference to FIG. 1, an LED package according to a first exemplary embodiment of the invention is described.

FIG. 1 is a cross-sectional view showing the LED package according to the first exemplary embodiment of the invention.

As shown in FIG. 1, the LED package 10 includes a silicon substrate 110, a conductive film 120, an LED 130, and an encapsulant 140. The silicon substrate 110 has a cavity 112 and through-holes 116 formed therein. The conductive film 120 is disposed inside the through-holes 116, on the side surface of the cavity 112. The LED 130 is provided on the conductive film 120, and the encapsulant 140 is formed to encapsulate the cavity 112.

The cavity 112, which has a tapered shape, is formed in the central portion of the silicon substrate 110, and a stepped portion 114 is formed on the upper end of the cavity 112. The stepped portion 114 is formed in a predetermined portion of the upper surface of the cavity 112 in order to prevent surface defects, which would otherwise occur when the encapsulant 140 is formed to encapsulate the cavity 112 as will be described later.

The silicon substrate 110 has the through-holes 116 in the lower portion of the cavity 112 in which the LED 130 is mounted. The through-holes 116 are filled with a conductive material, as will be described later, by which the LED 130 is electrically connected to lead frames (not shown) of the LED package 10.

The conductive film 120 is made of the conductive material, which fills the through-holes 116, and is formed on the bottom and the side surface of the cavity 112 in which the LED 130 is mounted and on the underside of the silicon substrate 110. As shown in FIG. 1, the conductive film 120 is formed under the stepped portion 114, which is formed on the side surface of the cavity 112.

On the lower surface of the cavity 112 and inside the through-holes 116, the conductive film 120 has excellent electrical conductivity in order to electrically connect the LED 130 with the lead frames. On the side surface of the cavity, the conductive film 120 has excellent light reflectivity so that light generated from the LED 130 can be easily radiated outward. For example, the conductive film 120 can be an aluminum (Al) or silver (Ag) film having both excellent electrical conductivity and excellent light reflectivity.

Thanks to the use of the conductive film 120 having excellent electrical conductivity and light reflectivity, processes of forming a reflecting film, electrodes, and conductive through-holes can be simplified.

In addition, it is required that two sections of the conductive film 120 be electrically isolated from each other, since they are connected to opposite electrodes of the LED 130. For this, a dam 118 is formed on the central portion of the cavity 112.

The dam 118 can be a film of silicon dioxide ($SiO_2$), or can be made of one selected from among titanium (Ti), chromium (Cr), and platinum (Pt). The dam 118 is formed to prevent a flow of molten solder bumps 132 from causing a short circuit or decreasing bonding ability.

The LED 130 includes a light-emitting layer made of a nitride semiconductor layer, and a fluorescent layer 134 is formed on the upper surface of the LED 130. Here, the fluorescent layer 134 can be a layer that is formed by mixing fluorescent particulates in the form of grains with silicone (or epoxy) at a predetermined ratio.

The LED 130 is flip-chip bonded onto the conductive film 120, which is on the bottom of the cavity 112. That is, the LED 130 is mounted on the conductive film 120 using the solder bumps 132 or Au stud bumps, which are on the underside of the LED 130.

The encapsulant 140 encapsulates the hollow space of the cavity 112. The encapsulant can be epoxy or silicone gel having excellent light transparency.

Below, with reference to FIG. 2, a description will be given of a method of fabricating the LED package according to the first exemplary embodiment of the invention.

Figure 2:
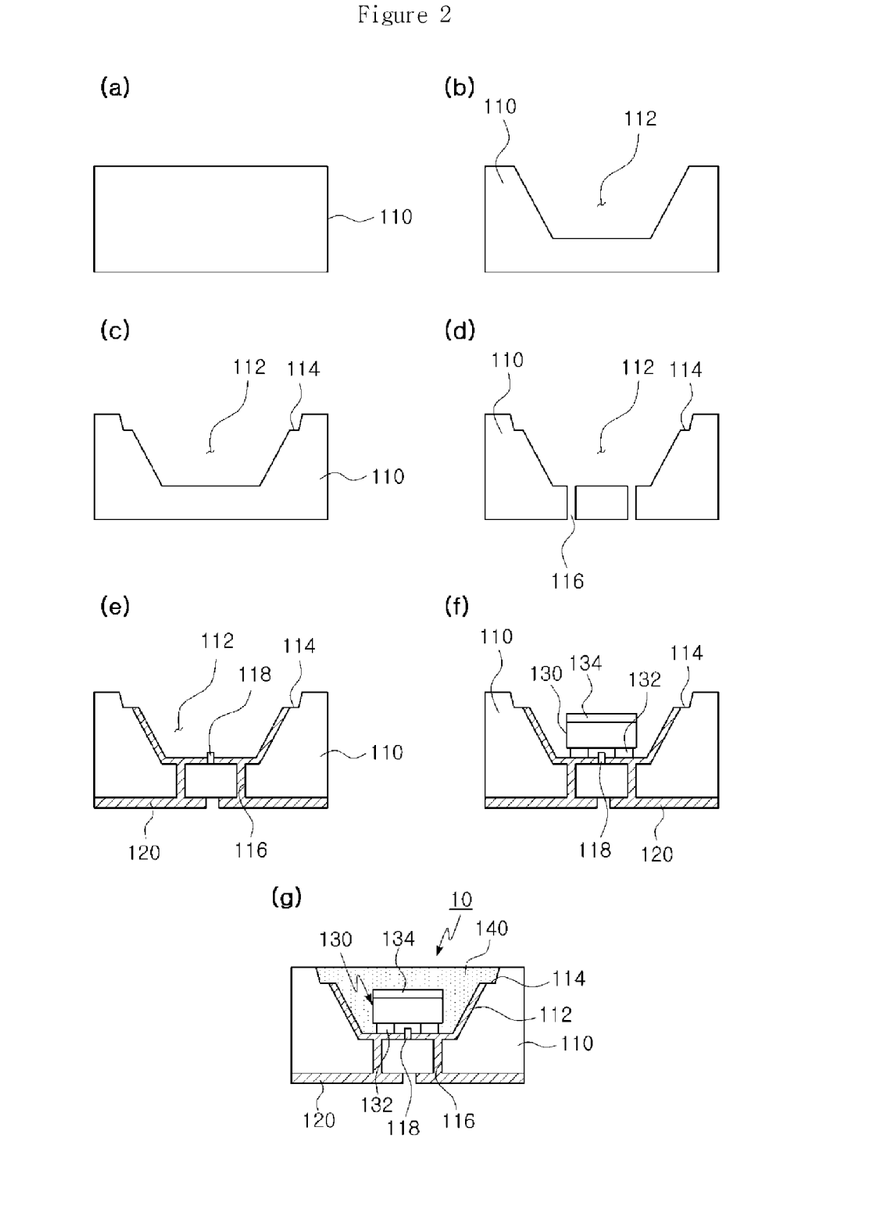
FIG. 2 are cross-sectional views showing a process of fabricating the LED package according to the first exemplary embodiment of the invention.

FIG. 2 are cross-sectional views showing a process of fabricating the LED package according to the first exemplary embodiment of the invention.

First, as shown in FIG. 2a, an insulating silicon substrate 110 is prepared.

A pattern for the cavity 112 is formed on the upper portion of the silicon substrate 110 via photolithography, and the silicon substrate 110 is etched using anisotropic wet etching solution, such as Potassium Hydroxide (KOH), Tetramethylammonium Hydroxide (TMAH), or Ethylenediamine Pyrocatechol (EDP), thereby forming the cavity 112, as shown in FIG. 2b, in which the LED 130 is intended to be mounted.

As shown in FIG. 2c, a pattern is formed on the area in which the cavity 112 is formed via photolithography, and the silicon substrate 110 is etched using a wet etching solution as described above, thereby forming the stepped portion 114 on the upper end of the cavity 112.

As shown in FIG. 2d, the through-holes 116 are formed in the bottom of the cavity 112 using a laser or a chemical agent, such that they penetrate the lower portion of the silicon substrate 110.

As shown in FIG. 2e, a photolithography pattern is formed by dividing the bottom of the cavity 112 into a negative electrode area and a positive electrode area of the LED 130. Here, the dam 118 is formed on the central portion of the bottom of the cavity 112 such that the area corresponding to the positive electrode of the LED 130 is divided from the area corresponding to the negative electrode of the LED 130. The dam 118 is formed by depositing one selected from among a silicon dioxide ($SiO_2$) film, Ti, Cr, and Pt, using sputtering or electron beam vapor deposition, and the pattern is formed using a lift-off technique.

The through-holes 116 of the cavity 112 are filled with a conductive material via plating, and the conductive material is deposited on the bottom and the side surface of the cavity 112 using electron beam deposition and thermal deposition. Here, the conductive film 120 made of the conductive material, which is deposited on the bottom and the side surface of the cavity 112, is formed to extend from the bottom of the cavity 112 to the stepped portion 114 on the upper end of the side surface of the cavity 112.

It is preferable that the conductive film 120 be made of Al or Ag, which has excellent electrical conductivity and light-reflectivity characteristics.

As shown in FIG. 2f, the LED 130 having the fluorescent layer 134 is flip-chip bonded to the conductive film 120 on the bottom of the cavity 112 using the solder bumps 132 or Au stud bumps. Here, the fluorescent layer 134 is applied on the LED 130 via one selected from among spraying, screen printing, dipping, stenciling, or the like.

As shown in FIG. 2g, the hollow space of the cavity 112 is filled with epoxy or silicone gel having excellent light transparency.

Although not shown in the figures, a subsequent process is performed by dividing the silicon substrate 110 with the LED 130 flip-chips bonded thereto via dicing.

As described above, the LED package, which has excellent heat dissipation characteristics, can be easily fabricated at low cost by packaging the LED 130 on the silicon substrate 110.

Figure 3:
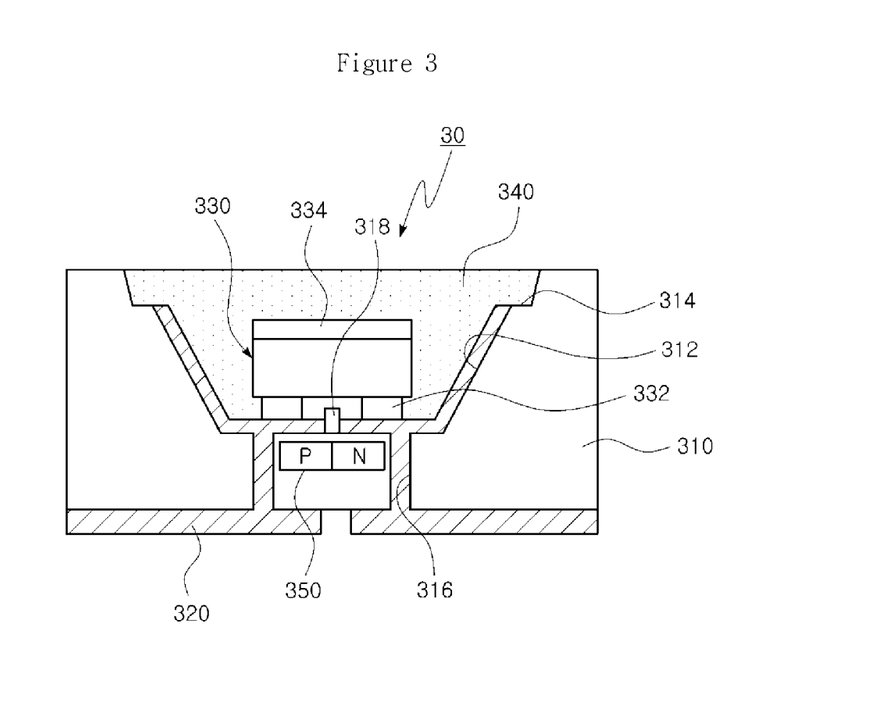
FIG. 3 is a cross-sectional view showing an LED package according to a second exemplary embodiment of the invention.
Figure 4:
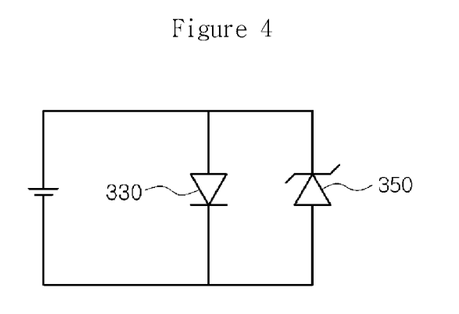
FIG. 4 is an equivalent circuit diagram of the LED package shown in FIG. 3.

FIG. 3 is a cross-sectional view showing an LED package according to a second exemplary embodiment of the invention, and FIG. 4 is an equivalent circuit diagram of the LED package shown in FIG. 3.

This embodiment has a configuration the same as that of the first embodiment, except that a Zener diode 350 is provided in the lower portion of a silicon substrate 310. Therefore, descriptions of identical components are omitted.

The Zener diode 350 is formed in an area of the silicon substrate 310 under a cavity 312, specifically, inside the silicon substrate 310. As shown in FIG. 3, an n-area and a p-area in the silicon substrate 310 form the Zener diode 350.

As shown in FIG. 4, this LED package 30 can improve the voltage resistance characteristics of an LED 330, since the Zener diode 350 is arranged in parallel with the LED 330 to divert excessive current, which would otherwise flow through the LED 330.

A method of fabricating this LED package 30 having the Zener diode 350 includes the following steps of: forming the cavity 312 and through-holes 316 in the silicon substrate 310 in the fashion as described above, and forming the Zener diode 350 in the area of the silicon substrate 310 under the cavity 312 by ion implantation.

The formation of the Zener diode 350 in the silicon substrate 310 as described above can simplify processing by obviating the use of an additional Zener diode, thereby making it possible to easily fabricate the LED package at low cost and to miniaturize the LED package.

Figure 5:
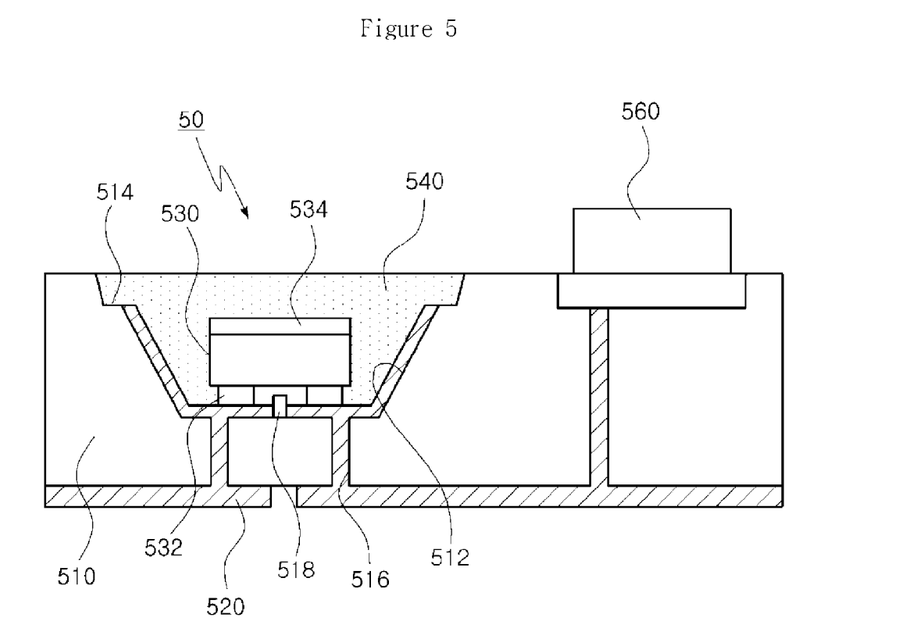
FIG. 5 is a cross-sectional view showing an LED package according to a third exemplary embodiment of the invention.
Figure 6:
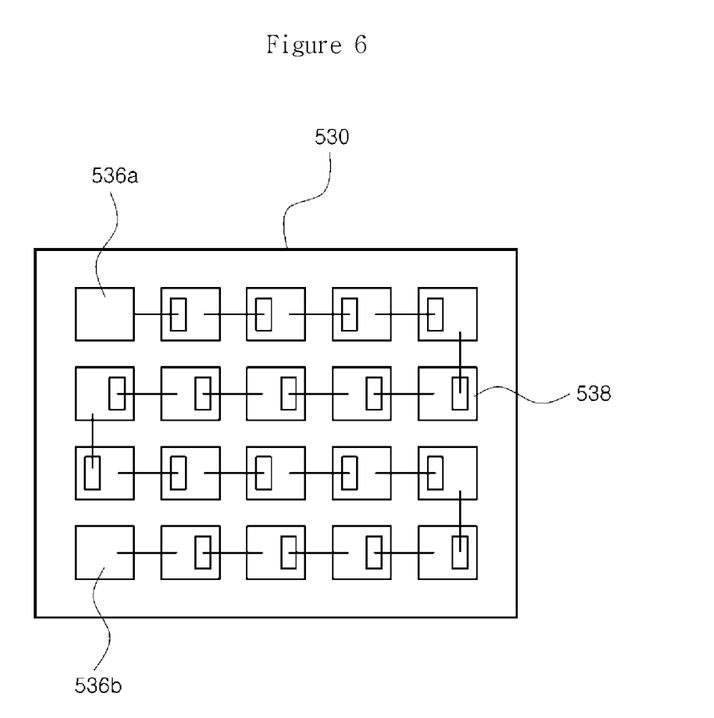
FIG. 6 is a plan view of the LED package shown in FIG. 5.
Figure 7:
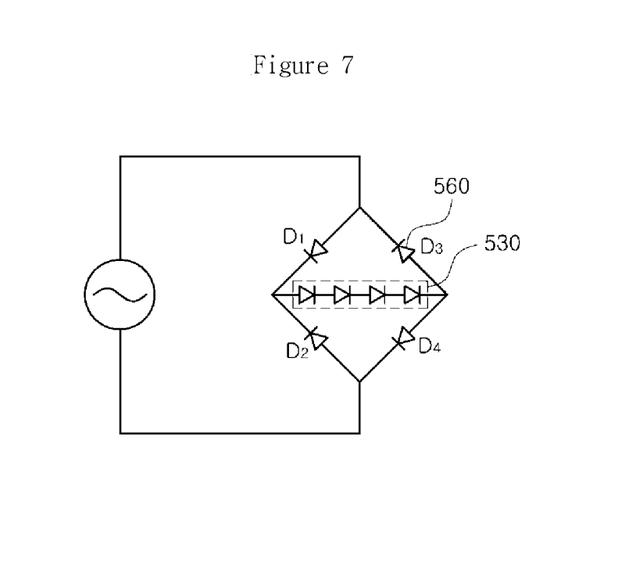
FIG. 7 is an equivalent circuit diagram of the LED package shown in FIG. 5.
Figure 8:
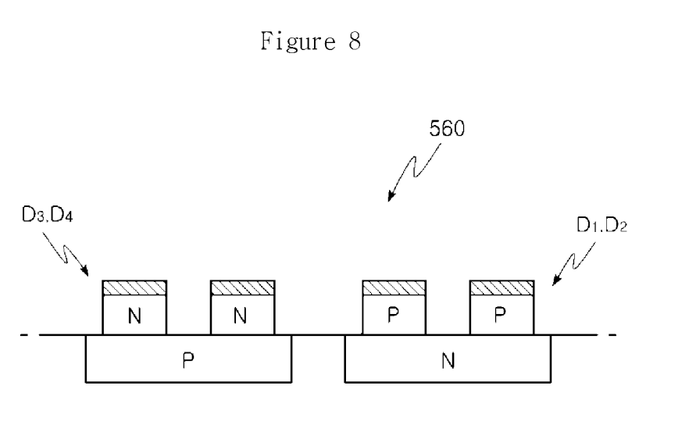
FIG. 8 is a cross-sectional view showing an example of the rectifier shown in FIG. 5.

FIG. 5 is a cross-sectional view showing an LED package according to a third exemplary embodiment of the invention, FIG. 6 is a plan view of the LED package shown in FIG. 5, FIG. 7 is an equivalent circuit diagram of the LED package shown in FIG. 5, and FIG. 8 is a cross-sectional view showing an example of the rectifier shown in FIG. 5.

This embodiment has a configuration the same as that of the first embodiment, except that an LED 530 includes a plurality of light-emitting cells and a rectifier 560 is provided on the upper surface of a silicon substrate 510. Therefore, descriptions of identical components are omitted.

The LED 530 includes the multiple light-emitting cells such that it can operate at a high voltage.

As shown in FIG. 6, the LED 530 includes electrode pads 536a and 536b and the multiple light-emitting cells 538. The light emitting cells 538 and the electrode pads 536a and 536b electrically connected to each other. Although the light-emitting cells 538 have been illustrated herein as being connected in series, it is possible to divide the light-emitting cells 538 into several sections, in which corresponding light-emitting cells 538 are connected in series, and electrically connect the sections to each other in parallel.

The rectifier 560 is formed on the silicon substrate 510, in the area above the cavity 512. The rectifier 560 can be a diode bridge, as shown in FIG. 7.

As above, the diode bridge 560 rectifies current, which is applied from the outside, before the current is applied to the LED 130, so that the LED 130 can operate at a high Alternating Current (AC) voltage. That is, when the AC voltage is applied, D1/D4 diodes and D2/D3 diodes of bridge diodes are alternately turned on, so that the LED 530 including the multiple light-emitting cells 538 is switched on.

As shown in FIG. 8, the rectifier 560 can include a p-area and an n-area, which are formed in the upper surface of the silicon substrate 510, a pair of n-semiconductor layers D3 and D4, which are formed on the p-area, and a pair of p-semiconductor layers D1 and D2, which are formed on the n-area.

Below, describing a method of fabricating the above-described LED package 50, a cavity and through holes 516 are formed in the silicon substrate 510, and the rectifier 560 is formed in the upper portion of the silicon substrate 510, so that the LED can operate at a high AC voltage. Here, the LED 530 includes the multiple light-emitting cells 538.

The rectifier 560 can be provided as the diode bridges. As shown in FIG. 8, the diode bridge rectifier 560 can be prepared by forming the p-area and the n-area in the upper surface of the silicon substrate 110, a pair of the n-semiconductor layers D3 and D4 on the p-area, and a pair of the p-semiconductor layers D1 and D2 on the n-area.

Although the diodes formed in the silicon substrate 110 are described in this embodiment as including one pair of the diodes D1/D2 and the other pair of the diodes D3/D4, the diodes formed in the silicon substrate 110 can include one pair of the diodes D1/D3 and the other pair of the diodes D2/D4 according to the characteristics of the bridges.

The formation of the rectifier 560 in the silicon substrate 510 as described above can simplify processing by obviating the use of an additional rectifier, thereby making it possible to easily fabricate the LED package at low cost and to miniaturize the LED package.

While the present invention has been shown and described with reference to the certain exemplary embodiments thereof, it will be apparent to those skilled in the art that various changes in form and details may be made therein without departing from the spirit and scope of the present invention and such changes fall within the scope of the appended claims.

The invention claimed is:

1. A light-emitting diode package comprising:
   a substrate, wherein the substrate defines therein a cavity having a tapered shape, a stepped portion formed on an upper end of the cavity, and a through hole formed in a bottom of the cavity;
   a conductive film, wherein the conductive film fills the through-hole and is formed on the bottom and side surfaces of the cavity, the conductive film not being disposed on the stepped portion;
   a light-emitting diode having a fluorescent layer thereon, wherein light-emitting diode is flip-chip bonded onto the conductive film; and
   an encapsulant encapsulating the cavity.

2. The light-emitting diode package according to claim 1, wherein the conductive film is an Al film or an Ag film.

3. The light-emitting diode package according to claim 1, wherein the conductive film is formed under the stepped portion.

4. The light-emitting diode package according to claim 1, wherein the substrate is a silicon substrate.

5. The light-emitting diode package according to claim 4, further comprising a Zener diode formed in an area of the substrate under the cavity.

6. The light-emitting diode package according to claim 4, wherein the light-emitting diode includes a plurality of light-emitting cells.

7. The light-emitting diode package according to claim 6, further comprising a rectifier formed on an upper portion of the substrate.

8. The light-emitting diode package according to claim 7, wherein the rectifier is a diode bridge.

9. A method of fabricating a light-emitting diode package, comprising:
   preparing an insulating silicon substrate;
   forming a cavity in the silicon substrate and a stepped portion formed in an upper end of the cavity, wherein a light-emitting diode is intended to be mounted in the cavity;
   forming a through-hole in a bottom of the cavity;
   forming a conductive film only on the through-hole, the bottom, and side surfaces of the cavity, and not on the stepped portion;
   flip-chip bonding the light-emitting diode on the conductive film on the bottom of the cavity, wherein the light-emitting diode has a fluorescent layer formed thereon; and
   encapsulating the cavity.

10. The method according to claim 9, wherein the forming a conductive film comprises depositing Al or Ag on the bottom and the side surfaces of the cavity.

11. The method according to claim 10, wherein the conductive film is formed under the stepped portion.

12. The method according to claim 9, further comprising forming a Zener diode on the silicon substrate in an area under the cavity after the forming a through-hole.

13. The method according to claim 12, wherein the Zener diode is formed by ion implantation.

14. The method according to claim 9, wherein the light-emitting diode includes a plurality of light-emitting cells.

15. The method according to claim 14, further comprising forming a rectifier on an upper portion of the silicon substrate after the forming a cavity.

16. The method according to claim 15, wherein the rectifier is formed by bridging diodes on the substrate.

* * * * *